(12) United States Patent
Miyajima et al.

(10) Patent No.: US 7,927,058 B2
(45) Date of Patent: Apr. 19, 2011

(54) POD CLAMPING UNIT LOAD PORT EQUIPPED WITH POD CLAMPING UNIT AND MINI ENVIRONMENT SYSTEM INCLUDING POD AND LOAD PORT

(75) Inventors: Toshihiko Miyajima, Tokyo (JP); Jun Emoto, Tokyo (JP); Hidetoshi Horibe, Tokyo (JP)

(73) Assignee: TDK Corporation, Tokyo (JP)

( * ) Notice: Subject to any disclaimer, the term of this patent is extended or adjusted under 35 U.S.C. 154(b) by 449 days.

(21) Appl. No.: 11/691,683

(22) Filed: Mar. 27, 2007

(65) Prior Publication Data

US 2007/0231112 A1 Oct. 4, 2007

(30) Foreign Application Priority Data

Mar. 29, 2006 (JP) ................................. 2006-089922

(51) Int. Cl.
*B65G 49/07* (2006.01)
(52) U.S. Cl. ..................... 414/217.1; 414/411; 414/940
(58) Field of Classification Search .................. 414/411, 414/217.1, 940, 217, 939; 410/80; 70/278.7, 70/280
See application file for complete search history.

(56) References Cited

U.S. PATENT DOCUMENTS

| | | | | |
|---|---|---|---|---|
| 5,137,063 A * | 8/1992 | Foster et al. | | 414/217 |
| 5,302,078 A * | 4/1994 | Essick et al. | | 414/411 |
| 6,501,070 B1 * | 12/2002 | Bacchi et al. | | 250/239 |
| 7,467,919 B2 * | 12/2008 | Weaver | | 414/815 |
| 7,621,714 B2 * | 11/2009 | Miyajima et al. | | 414/411 |
| 7,793,906 B2 * | 9/2010 | Natsume | | 248/316.1 |
| 2002/0044859 A1 * | 4/2002 | Lee et al. | | 414/411 |
| 2002/0051701 A1 * | 5/2002 | Saeki et al. | | 414/222.01 |
| 2004/0127048 A1 * | 7/2004 | Okabe et al. | | 438/691 |
| 2005/0095098 A1 | 5/2005 | Miyajima et al. | | |

FOREIGN PATENT DOCUMENTS

| | | | | |
|---|---|---|---|---|
| JP | 54-152594 A | * 11/1979 | | 414/411 |
| JP | 7-183354 | 7/1995 | | |
| JP | 2000-16583 | 1/2000 | | |
| JP | 3076831 | 1/2001 | | |
| JP | 2002-164412 | 6/2002 | | |
| JP | 2004-296646 | 10/2004 | | |
| JP | 2005-129706 | 5/2005 | | |
| JP | 2005-209891 | 8/2005 | | |
| KR | 10-0583726 | 5/2006 | | |

* cited by examiner

*Primary Examiner* — James Keenan
(74) *Attorney, Agent, or Firm* — Oblon, Spivak, McClelland, Maier & Neustadt, L.L.P.

(57) ABSTRACT

The invention is directed to a pod clamping unit for fixing a pod to a support table in a load port, the pod including a pod body capable of storing a wafer in the interior thereof and a lid, the load port having a pod opener that opens/closes the lid. The pod clamping unit includes a clamp portion that is provided on the support table and adapted to engage with a first engagement portion provided on a lower surface of the pod body to restrict upward movement of the pod relative to the support table, a restriction pin that is movable upwardly and downwardly relative to the support table and adapted to engage with a second engagement portion provided on the lower surface of the pod body to restrict movement of the pod in a disengaging direction that causes disengagement between the first engagement portion and the clamp portion, and a vertically driving portion that moves the restriction pin up to/down from the second engagement portion.

9 Claims, 6 Drawing Sheets

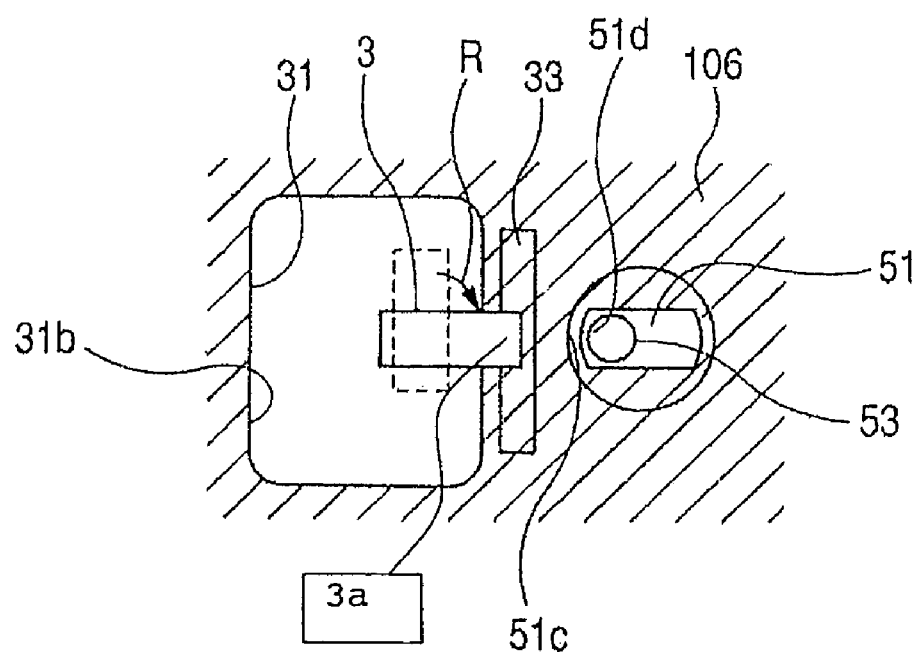

POD CLAMPING UNIT LOAD PORT
EQUIPPED WITH POD CLAMPING UNIT
AND MINI ENVIRONMENT SYSTEM
INCLUDING POD AND LOAD PORT

BACKGROUND OF THE INVENTION

1. Field of the Invention

The present invention relates to what is called an FIMS system (front-opening interface mechanical standard system) (or load port) that is used in semiconductor manufacturing process, upon transferring a wafer(s) stored in a transport container called a pod into a semiconductor processing apparatus, as a structure on which the pod is placed. More particularly, the present invention relates to components related to an FIMS system on which a pod (one referred to as an FOUP (front-opening unified pod)) is placed and that transfers a semiconductor wafer(s) from the pod, namely a pod clamping unit for fixing a pod on the FIMS system, a load port on which a pod compatible with that clamping unit is to be placed, and a mini-environment system including a pod and a load port that are compatible with that clamping unit.

2. Related Background Art

In the past, the semiconductor manufacturing process had been performed in what is called a clean room constructed by establishing a high degree of cleanness in the room in which semiconductor wafers are handled. In recent years, however, in view of an increase in the wafer size and with a view to reduce cost incurred in maintenance of the clean room, a method of keeping clean only the interior of a processing apparatus, a pod (or wafer container) and a small space through which substrates or wafers are transferred between the pod and the processing apparatus has been used.

The pod is composed of a body portion of a substantially cubical shape having shelves provided therein that can hold a plurality of wafers in a parallel and separated state and an opening provided on one side thereof through which wafers can be brought into/out of it, and a lid for closing the opening. Those pods which have an opening portion provided not on the bottom but on one lateral side thereof (i.e. the front side to be opposed to the small space) are collectively called FOUP (front-opening unified pod). The present invention is directed to technologies in which the FOUP is used.

A system provided with the above mentioned small space has a first opening opposed to the opening of the pod, a first door for closing the first opening, a second opening provided on a semiconductor processing apparatus, and a transferring robot that is adapted to reach into the interior of the pod through the first opening to pick up a wafer and transfer it into the processing apparatus through the second opening. The system provided with the small space also has a support table that supports the pod in such a way that the pod opening is placed just in front of the door.

On the top face of the support table are positioning pins to be fitted into positioning holes provided on the bottom surface of the pod and a clamp portion adapted to engage with a portion to be clamped provided on the bottom surface of the pod to fix the pod to the support table. Typically, the support table is adapted to be movable toward and away from the door over a predetermined distance. When the wafers in a pod are to be transferred into the semiconductor processing apparatus, the support table on which the pod is placed moves toward the door until the lid of the pod abuts the door, and then after abutment, the lid is removed by the door, whereby the opening of the pod is opened. By this process, the interior of the pod and the interior of the processing apparatus are brought into communication with each other through the small space to allow wafer transferring operations that will be performed repeatedly. All of the support table, the door, the first opening, a mechanism for opening/closing the door and walls partly defining the small space and having the first opening are included in what is referred to as an FIMS system (front-opening interface system) or a mini-environment system.

A clamping mechanism used in the FIMS system is composed of an engagement recess provided on the bottom surface of the pod and a clamp portion provided on the support table. The engagement recess has a portion to be clamped extending toward the center of the recess to cover a part of the opening of the recess. A known conventional clamping mechanism is disclosed in Japanese Patent Application Laid-Open No. 2002-164412 (which will be referred to as patent document 1 hereinafter). The clamp portion 503 disclosed in patent document 1 is of what is called a front-retaining type. As shown in FIG. 9, the clamp portion 503 used in the front-retaining system is a substantially rod-like member that is supported in a swingable manner. The clamp portion 503 has a hook claw 504 provided at a first end thereof, and the second end thereof is connected to an actuator 540. In this structure, the actuator 540 drives the second end of the clamp portion 503 to cause the clamp portion 503 to swing, whereby the hook claw 504 is brought into engagement with the portion to be clamped 533 provided on the pod 506. Thus, dislocation of the pod 506 from the support table 519 is prevented.

In the system disclosed in patent document 1 in which the pod 506 is secured on the support table 519 only by front retaining, if the pod 519 is displaced (as shown by the broken lines) by an excessive external force acting on the pod 519 in the obliquely upward direction (indicated by arrow z in FIG. 9), there is a risk that the clamp portion 504 and the portion to be clamped 533 may be disengaged and the pod 506 may be dislocated from the support table 519 inadvertently.

Furthermore, with an increase in the weight of the pod accompanied by an increase in the size thereof, a load generated by inertia upon moving the pod and an impact force that may be caused upon transferring a wafer also becomes larger. In such cases, the fastening ability of conventional clamp units is relatively low, and the position of the pod may be displaced and the pod may be dislocated by a load that acts on the pod upon movement of the pod or other occasions.

In a known conventional structure, positioning pins are provided on the upper surface of the support table in such a way as to project therefrom, and positioning holes complementary to the positioning pins are provided on the bottom surface of the pod so that positioning pins are fitted into the positioning holes when the pod is placed on the support table. However, the diameter of the opening of the positioning hole is larger than the diameter of the positioning pin, and the cavity of the positioning hole is countersunk (i.e. the wall of the cavity is slanted toward the center of the hole) so that the positioning pins of the pod can slide into the corresponding positioning holes. Since the circumferential wall of the positioning hole is slanted, when a load is applied in an oblique direction, the positioning pins and the positioning holes are easily disengaged. Therefore, it is difficult to keep the pod in the fixed state.

Furthermore, in the case of positioning pins in the form of projections having a triangular cross section, a SEMI standard requires that the positioning pins can fit into the positioning holes even when the pod is placed with a misalignment of about ±10 mm relative to the positioning holes. Accordingly, they do not function effectively in keeping the pod fixed.

SUMMARY OF THE INVENTION

The present invention has been made in view of the above described situations and has as an object to provide a pod clamping unit that can reliably keep a pod fixed on a support table even if a load is applied inadvertently on the pod, a load port having such a pod clamping unit and a mini-environment system including such a unit and a load port.

According to one aspect of the present invention that is intended to achieve the above mentioned object, there is provided a pod clamping unit for fixing a pod to a support table in a load port, the pod including a pod body capable of storing a wafer in the interior thereof and having an opening through which the wafer is to be taken out of/brought into the interior of the pod and a lid attached to the pod body to close/open the opening, the load port having a pod opener that opens/closes the lid to allow to bring the wafer out of/into the interior of the pod, the pod clamping unit including a clamp portion that is provided on the support table and adapted to engage with a first engagement portion provided on a lower surface of the pod body to restrict upward movement of the pod relative to the support table, a restriction pin that is movable upwardly and downwardly relative to the support table and adapted to engage with a second engagement portion provided on the lower surface of the pod body to restrict movement of the pod in a disengaging direction that causes disengagement between the first engagement portion and the clamp portion, and a vertically driving portion that moves the restriction pin up to/down from the second engagement portion.

According to another aspect of the present invention that is intended to achieve the above mentioned object, there is provided a load port apparatus that includes an apparatus body to be mounted on a semiconductor manufacturing apparatus and a support table on which a pod that contains a wafer to be processed by the semiconductor manufacturing apparatus is to be set, wherein the support table is equipped with the above described pod clamping unit.

According to still another aspect of the present invention, there is provided a mini-environment system that includes a pod including a pod body that stores a wafer in the interior thereof and has an opening through which the wafer is to be taken out of/brought into the interior of the pod and a lid attached to the pod body to close/open the opening, and a load port including a support table on which the pod is to be placed and a pod opener that opens/closes the lid to allow to bring the wafer out of/into the interior of the pod, wherein the support table is equipped with the above described pod clamping unit.

According to the present invention, when a load is applied inadvertently on the pod, movement of the pod in a direction that causes disengagement between the clamp portion and a portion is restricted by the restriction unit. Thus, dislocation of the pod from the support table can be prevented. Accordingly, the pod can be kept fixed on the support table with reliability.

The restriction pin that constitutes the restriction unit can be moved up and down, and in its initial state it is set at a position retracted from the upper surface of the support table. Therefore, it does not hinder pod mounting operations.

BRIEF DESCRIPTION OF THE DRAWINGS

FIG. 2 is a cross sectional view taken along line II-II in FIG. 1.

FIG. 3A illustrates a state before the clamping unit is brought into engagement with the pod. FIG. 3B illustrates a state in which the clamping unit is in engagement with the pod.

DESCRIPTION OF THE PREFERRED EMBODIMENTS

First Embodiment

Figure 1:
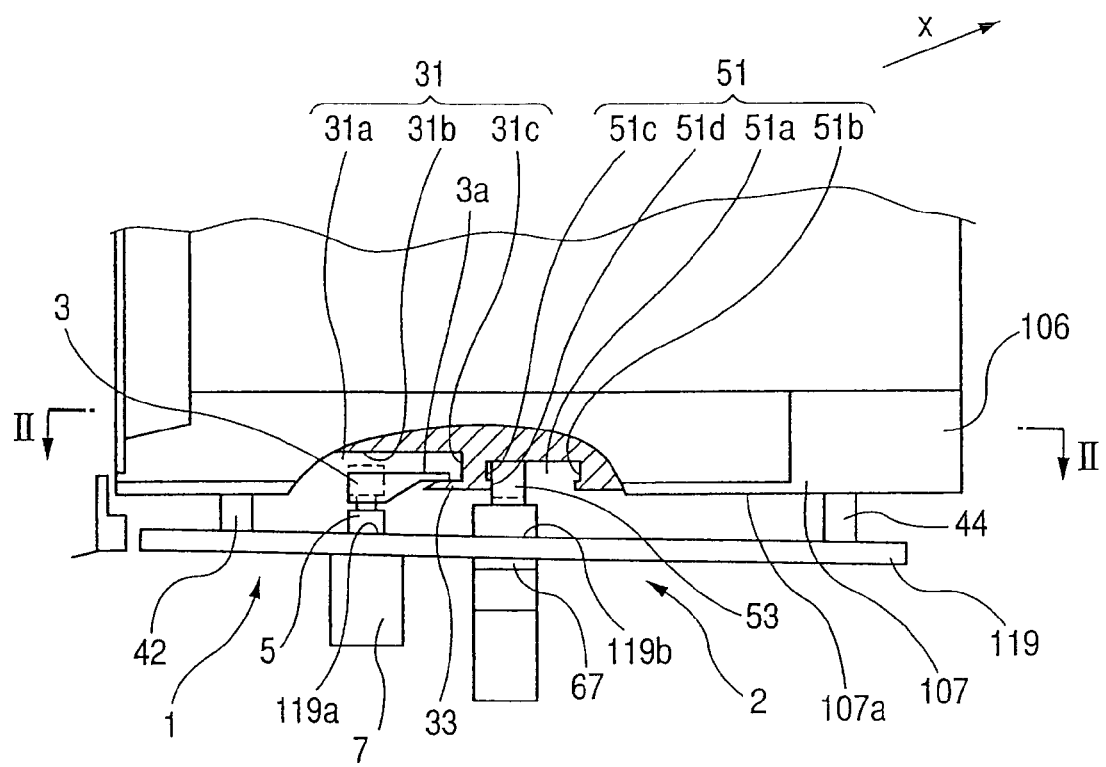
FIG. 1 is a partly sectional view schematically showing a clamping mechanism having a clamping unit according to a first embodiment of the present invention.

A first embodiment of the pod clamping unit according to the present invention will be described in the following with reference to the drawings. FIG. 1 schematically shows a clamping mechanism having a pod clamping unit according to an embodiment of the present invention. FIG. 2 is a cross sectional view taken along line II-II in FIG. 1. FIG. 2 shows a part of the pod body, as seen from the bottom plate side thereof, in the state in which the clamping unit is in engagement with the engagement portion of the pod.

The clamping mechanism includes a first engagement portion 31 and a second engagement portion 51 provided on the bottom plate 107 of the pod body 106, and a pod clamping unit provided on an FIMS system (i.e. a load port) 140. The pod clamping unit has a clamping unit 1 and a restricting unit 2. The first engagement portion 31 is an element that restricts movement of the pod with respect to the vertically upward direction (i.e. the upward direction in FIG. 1 or the direction in which the pod moves away from the support table), and the second engagement portion 51 is an element that restricts movement of the pod with respect to the horizontal direction (i.e. the horizontal direction in FIG. 1).

The first engagement portion 31 provided on the lower surface 107a of the bottom plate 107 of the pod body 106 has an engagement recess 31b (i.e. a cavity for what is called front-retaining), the opening 31a of the engagement recess 31b, a groove 31c cut on one side wall of the engagement recess 31b along the direction in which the bottom plate 107 extends (or the right direction in FIG. 1), and a portion to be clamped 33 defined by the groove 31c and the lower surface 107a of the bottom plate 106 in such a way as to protrude toward the center of the engagement portion 31. The width of the portion to be clamped 33 (i.e. its length along the vertical direction in FIG. 2) is designed to be larger than the width of a clamp portion 3 that will be described later. As shown in FIG. 2, the opening 31a has a substantially rectangular shape with round corners.

In this embodiment, the depth or internal vertical dimension of the engagement recess 31b is designed in such a way as to allow up-and-down movement of the clamp portion (which will be described later) that can move up and down in the interior of the engagement recess 31b. With this feature, the clamp portion 3 is positioned, in its initial state, in such a way as not to be in contact with the surface of the pod body 106 that defines the engagement recess 31b, and the end portion 3a of the clamp portion 3 is oriented upwardly in FIG. 2 (as illustrated by broken lines). The clamp portion 3 is adapted to be rotated in the direction indicated by arrow R and lowered so that the lower surface of the end portion 3a and the upper surface of the portion to be clamped 33 engage with each other. Since the clamp portion 3 is located on the left of the portion to be clamped 33, when the pod moves toward the end portion 3a, the end portion 3a abuts the groove 31c of the portion to be clamped 33. Thus, leftward horizontal movement of the pod (pod movement toward the left in FIG. 1) can be restricted.

The second engagement portion 51 provided on the right of the first engagement portion 31 has an engagement recess 51b (i.e. a cavity for what is called center retaining), the opening 51a of the engagement recess 51b and an abutment portion 51c. The opening 51a is defined by outer edges composed of a pair of opposed arc-shaped portions opposed to each other and two straight portions extending parallel to each other between the ends of the opposed arc-shaped portions. A restriction pin 53 that will be described later is positioned in such a way as to be in contact with the arc shaped surface 51d that is closer to the first engagement portion 31 or be spaced apart therefrom with a slight clearance.

In this embodiment, the depth or internal vertical dimension of the engagement recess 51b is designed in such a way as to allow up-and-down movement of the restriction pin (which will be described later) that can move up and down.

The pod body 106 has recesses or positioning holes (not shown) that open on the lower surface 107a of the bottom plate 107. Multiple positioning pins 42, 44 that project upwardly from the upper surface of the support table 119 are adapted to fit into the positioning holes so that rough positioning of the pod relative to the support table 119 is achieved.

The clamping unit 1 has a clamp portion 3, a cylinder rod 5, a vertically moving rotary cylinder 7. The clamp portion 3 is fixed on the upper end of the cylinder rod 5 that is extendable and retractable in the vertical direction (in the vertical direction in FIG. 1) passing through an aperture 119a formed on the support table 119. The cylinder rod 5 holds the clamp portion 3 in such a way that when the pod body 106 is placed on the support table 119, the clamp portion 3 assumes an initial position at which it is not in contact with the lower surface of the pod body 106.

The lower end of the cylinder rod 5 is supported on the vertically moving rotary cylinder 7. The vertically moving rotary cylinder 7 is mounted on the body of the FIMS below the support table 119. The vertically moving rotary cylinder 7 can extend/retract and helically rotate the cylinder rod 5. Accordingly, the cylinder rod 5 can moves up and down and rotate. The vertically moving rotary cylinder 7 may be a rotary clamp cylinder supplied by SMC, for example. The structure of such a cylinder per se is well known, and description thereof will be omitted.

If the restriction unit 2 is not provided, it is not possible only by engagement of the clamp portion 3 of the clamping unit 1 and the first engagement portion 31 to eliminate the risk that the pod body 106 will be dislocated from the support table 119 when an excessive load is exerted on the pod body 106 in the disengaging direction (i.e. the direction indicated by arrow x in FIG. 1) (see FIG. 1). The disengaging direction is obliquely upward direction (indicated by arrow x), which contains a horizontal component and a vertically upward component. With respect to the horizontal direction, displacement of the pod body 106 is restricted by the clamping unit 1, and with respect to the vertical direction, displacement of the pod body 106 is restricted by the restriction unit 2 that will be described in detail in the following.

The restriction unit 2 has a bar-shaped restriction pin 53, a vertical cylinder 67 that can move the restriction pin 53 up and down. The restriction pin 53 is fixed on a piston (not shown) received in the vertical cylinder 67 that extends vertically (along the vertical direction in FIG. 1) through an aperture 119b formed on the support table 119. Thus, the restriction pin 53 can be moved up and down. At the time when the pod 106 is placed on the support table 119, the restriction pin 53 is kept at a lowered, initial position (illustrated by broken lines) so that the lower surface 107a of the pod body 106 and the restriction pin 53 do not come in contact with each other.

The restriction pin 53 has a substantially circular radial cross section, and the outer circumferential side thereof will partly abut the abutment portion 51c of the engagement recess 51 or be slightly spaced apart from the abutment portion 51c. When operative, the restriction pin 53 restricts movement of the pod 106 in one horizontal direction (i.e. in the right direction in FIG. 1). The dimension of the restriction pin 53 is designed in such a way that the restriction pin 53 can abut the abutment portion 51c even when the pod 106 is inclined toward the direction indicated by arrow x.

The clamping mechanism including the restriction unit 2 and the clamping unit 1 having the above described structure operates in the following manner.

First, the pod is transported by a forklift onto the load port and placed on the support table so that the positioning pins 42, 44 are fitted into positioning holes provided on the support table. Then, the vertically and helically moving rotary cylinder 7 is driven to rotate and lower the lateral oriented clamp portion 3 (illustrated by broken lines in FIGS. 1 and 2) in a helical manner, so that the clamp portion 3 is opposed to the restriction pin 53. Then, the vertically moving rotary cylinder 7 is further driven to lower the clamp portion 3, so that the clamp portion 3 comes in engagement with the first engagement portion 33. Thus, movement of the pod in the upward direction is restricted.

The restriction unit 2 operates in the following manner. The vertical cylinder 67 is driven to move the restriction pin 53 up until the restriction pin 53 enters into the engagement recess 51b. The restriction pin 53 comes into abutment with the abutment surface 51d that constitutes the abutment portion 51c. Thus, movement of the pod in the horizontal direction is restricted. In addition, movement of the pod in the vertical direction (up and down direction) is restricted by the clamp unit 1. Accordingly, even when a force is exerted on the pod in an obliquely upward direction (i.e. in the disengaging direction indicated by arrow x) due to inadvertent application of load on the pod, the pod can be retained in the predetermined position.

As will be apparent, disengagement of the pod clamping unit is performed following the process reverse to the above described process. Needless to say, the operation procedures of the clamping unit and the restriction unit are not limited to those described in the above or those which will be described later.

Modification of the First Embodiment

A modification of the pod clamping unit according to the first embodiment will be described in the following. While the clamping unit according to the first embodiment uses a vertically moving rotary cylinder, the modification uses a vertical cylinder and a horizontal cylinder.

Figure 3A:
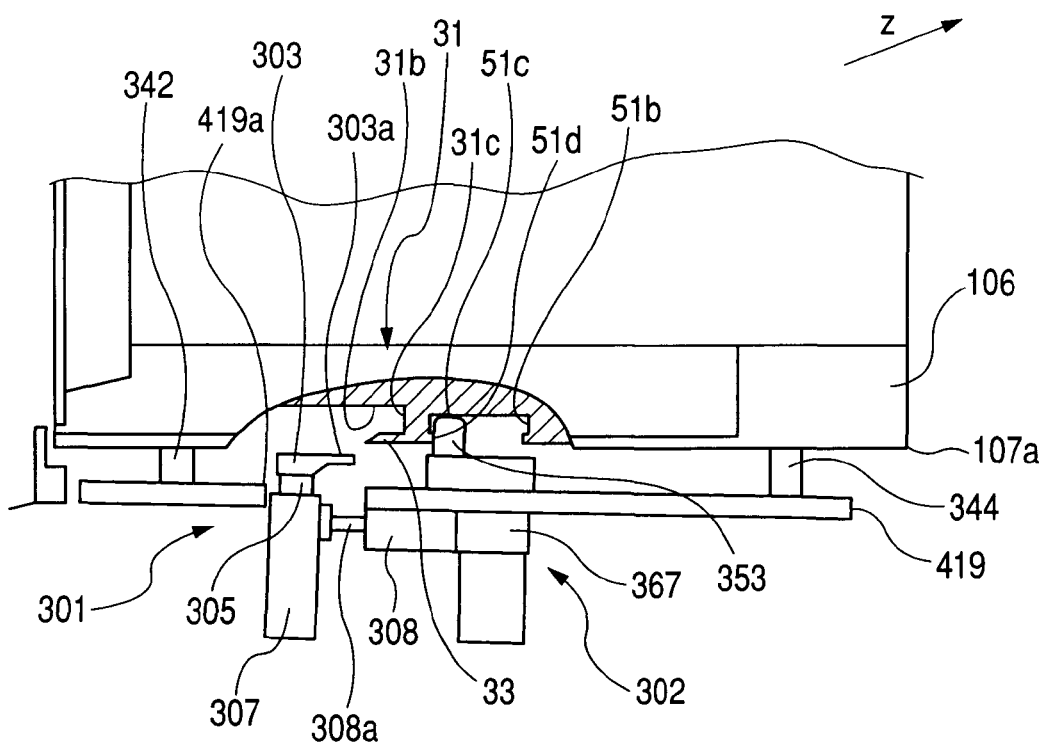
FIGS. 3A and 3B schematically show a cramping mechanism having a modification of the clamp unit according to the first embodiment.
Figure 3B:
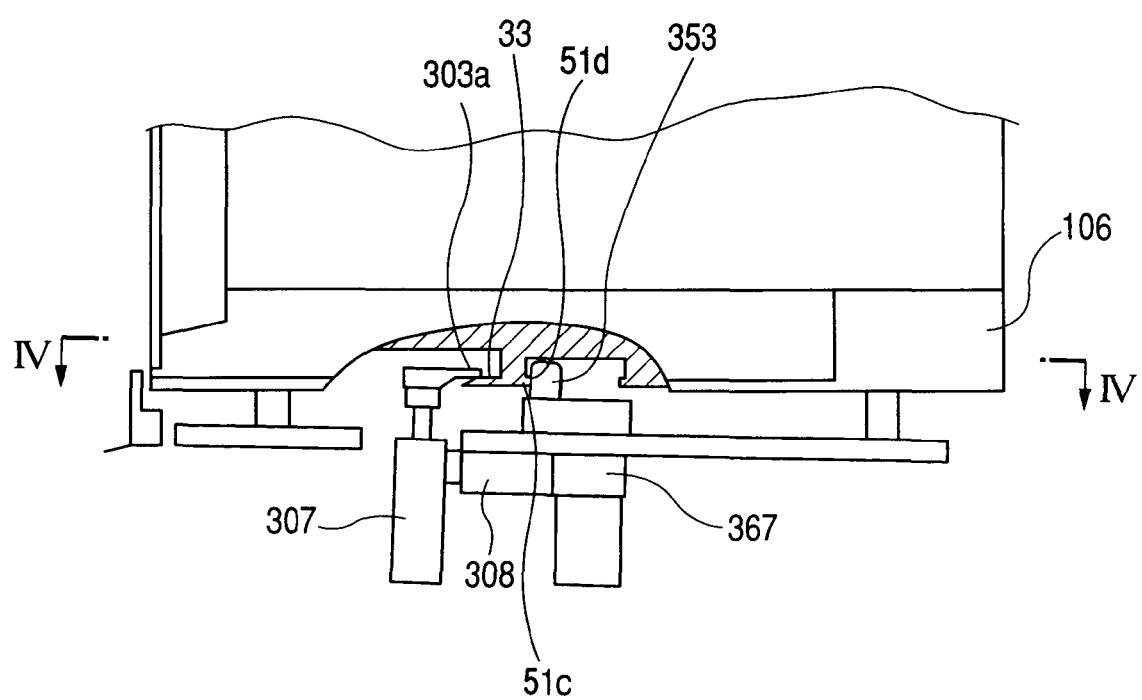
Figure 4:
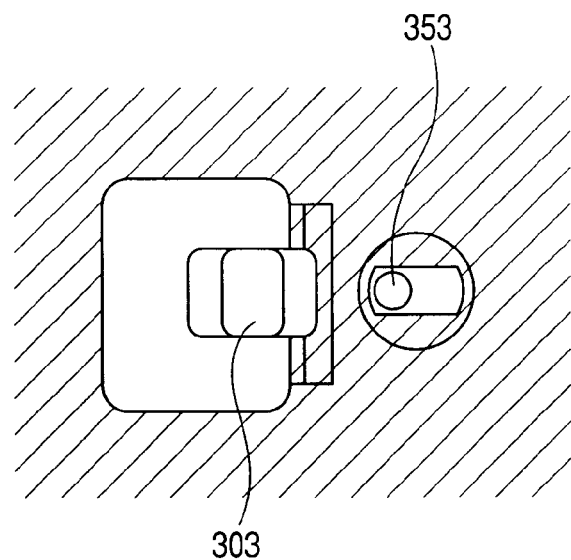
FIG. 4 is a cross sectional view taken along line IV-IV in FIG. 3B.

FIGS. 3A and 3B schematically show the structure of the clamping mechanism equipped with the pod clamping unit according to the modification of the first embodiment. FIG. 3A shows the state before the clamping unit engages the pod, and FIG. 3B shows the state in which the clamping unit is in engagement with the pod. FIG. 4 is a cross sectional view taken along line IV-IV in FIG. 3B. FIG. 4 shows a part of the pod body, as seen from the bottom plate side thereof, in the state in which the clamping unit is in engagement with the engagement portion of the pod. The structure of the pod used in this modification is the same as that used in the first embodiment. In the following, only the features of the pod clamping unit that are different from those in the first embodiment will be described.

The clamping unit 301 includes a clamp portion 303, a vertical cylinder rod 305, a vertical cylinder 307 serving as vertically moving means, a horizontal cylinder rod 308a and a cylinder rod 308 serving as horizontally moving means. The clamp portion 303 is fixed on the upper end of the vertical cylinder rod 305 that is extendable and retractable in the vertical direction (in the up-and-down direction in FIGS. 3A and 3B) passing through an aperture 419a formed on the support table 419. The vertical cylinder rod 305 holds the clamp portion 303 in such a way that when the pod body 106 is placed on the support table 419, the clamp portion 303 assumes an initial position at which it is not in contact with the lower surface of the pod body 106.

The lower end of the vertical cylinder rod 305 is attached to the vertical cylinder 307. The vertical cylinder 307 can operate to move the vertical cylinder rod 305 up and down, whereby the clamp portion 303 is moved up and down. The vertical cylinder 307 is mounted on the body of the FIMS below the support table 419. The vertical cylinder 307 is connected with one end of the horizontal cylinder rod 308a that extends horizontally relative to the vertical cylinder 307. The other end of the horizontal cylinder rod 308a is received in the horizontal cylinder 308. The horizontal cylinder 308 can move the horizontal cylinder rod 308a in the horizontal direction (i.e. in the left and right direction in FIGS. 3a and 3b). Thus, the horizontal cylinder 308 can operate to move the vertical cylinder 307 in the horizontal direction, whereby the clamp portion 303 is moved in the horizontal direction consequently.

The restriction unit 302 includes a bar-shaped restriction pin 353 and a vertical cylinder 367 that can move the restriction pin 353 up and down. The restriction pin 353 is fixed on a piston (not shown) received in the vertical cylinder 367 that extends vertically (along the vertical direction in FIG. 1) through the support table 419. The restriction pin 353 is moved up and down by driving the vertical cylinder 367. At the time when the pod 106 is placed on the support table 419, the restriction pin 353 is kept at a lowered, initial position so that the lower surface 107a of the pod body 106 and the restriction pin 353 do not come in contact with each other.

The restriction pin 353 has a substantially circular radial cross section, and the outer circumferential side thereof will partly abut the abutment portion 51c of the engagement recess 51b or be slightly spaced apart from the abutment portion 51c. When operative, the restriction pin 353 restricts movement of the pod 106 in one horizontal direction (i.e. in the right direction in FIG. 1). The dimension of the restriction pin 353 is designed in such a way that the restriction pin 53 can abut the abutment portion 51c even when the pod 106 is inclined toward the direction indicated by arrow z.

The clamping mechanism including the restriction unit 302 and the clamping unit 301 having the above described structure operate in the following manner.

The pod is transported by a forklift onto the load port and placed on the support table so that positioning pins 342, 344 are fitted into positioning hole provided on the support table. Then, the vertical cylinder 367 is driven to move the restriction pin 353 up until the restriction pin 353 enters into the engagement recess 51b. The restriction pin 353 comes into abutment with the abutment surface 51d, so that movement of the pod in the horizontal direction is restricted (FIG. 3A). Then, the vertical cylinder 307 is driven to move the clamp portion 303 up until the lower surface of the clamp portion 303 comes above the upper surface of a portion to be clamped 33. Then, the horizontal cylinder 308 is driven to retract the horizontal cylinder rod 308a by a predetermined length (thereby moving the vertical cylinder 307 to the right in FIGS. 3A and 3B). The vertical cylinder 307 is then driven again to move the clamp portion 303 down until the lower surface of the clamp portion 303 comes into contact with the upper surface of the portion to be clamped 33. Thus, upward movement of the pod is restricted. Accordingly, even when a force is exerted on the pod in an obliquely upward direction (i.e. in the disengaging direction indicated by arrow z) due to inadvertent application of load on the pod, the pod can be retained in the predetermined position. As will be apparent, disengagement of the pod clamping unit is performed following the process reverse to the above described process.

Second Embodiment

While in the first embodiment the restriction pin is inserted in the engagement recess for center retaining, in the second embodiment holes for forklift pin are used to restrict lateral movement of the pod body 106.

Figure 5:
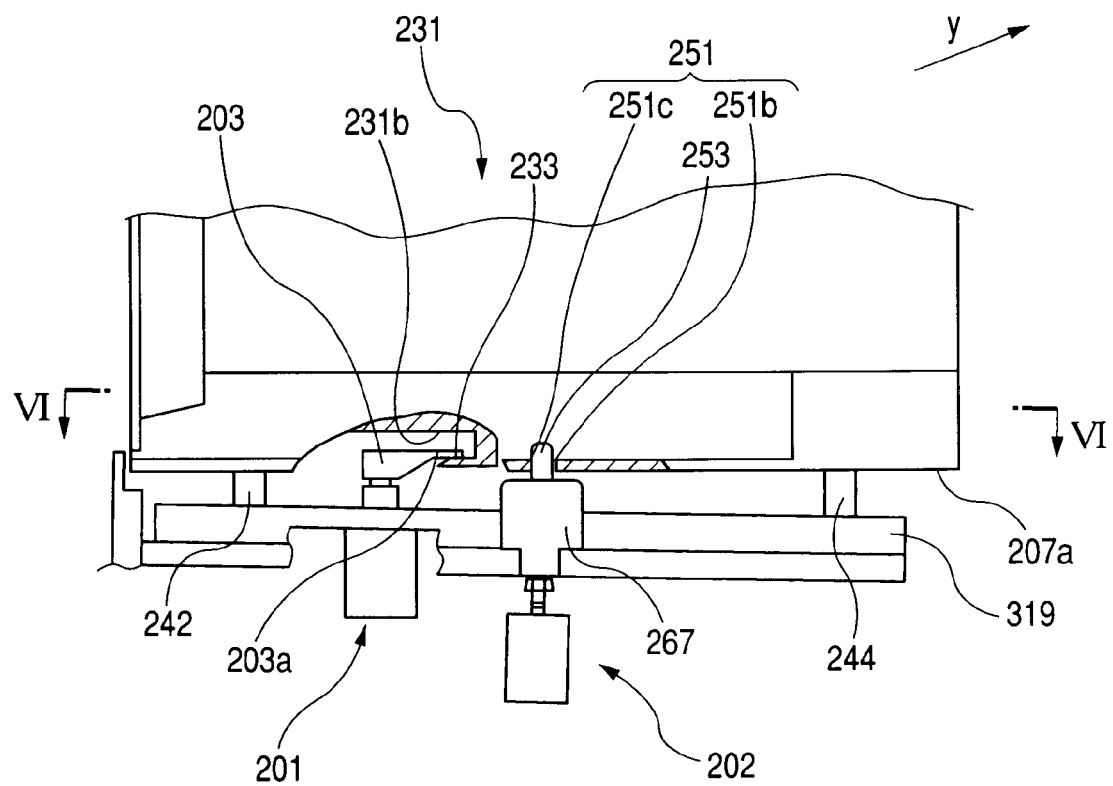
FIG. 5 is a side view of a clamping mechanism having a clamping unit according to the second embodiment.
Figure 6:
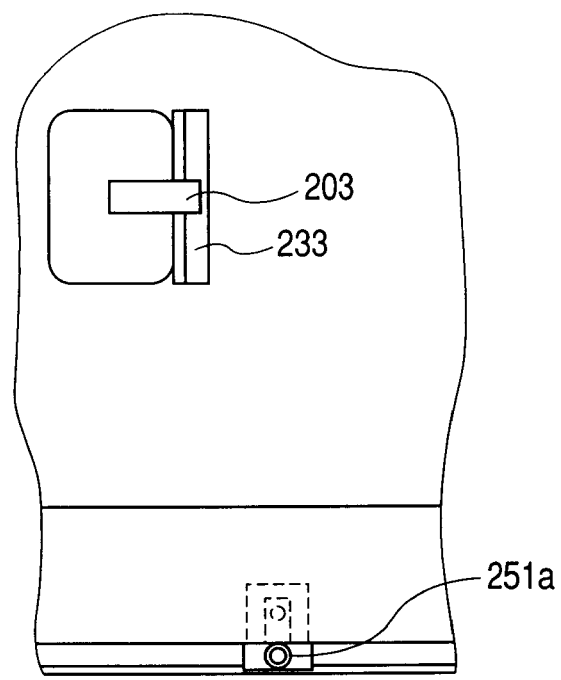
FIG. 6 is a cross sectional view taken along line VI-VI in FIG. 5.

FIG. 5 is a partial view schematically showing a part of a clamping mechanism having a clamping unit according to the second embodiment. FIG. 6 is a cross sectional view taken along line VI-VI in FIG. 5 and shows the clamping mechanism in operation as seen from the bottom plate side of the pod body. The clamp portion and the first engagement portion in the second embodiment are the same as those in the first embodiment. In the following, only the restriction unit and the second engagement portion will be described.

In compliance with a SEMI standard, positioning holes serving as holes 251b for receiving forklift pin are provided on the edge of the bottom plate 207 of the pod body 206. When the pod is transported, forklift pins provided on a forklift used as transportation means for transporting the pod body 206 fit into the holes 251b for forklift pin, whereby the pod is secured to the forklift. After the pod is placed on the support table 319, the forklift is detached from the lower surface 207a of the pod body 206. Accordingly, the holes for forklift pin 251b are normally not in use when the pod is set on the support table 319.

The holes 251b for forklift pin are spaced apart from the portion to be clamped 233 with respect to the direction along which the portion to be clamped 233 of the first engagement portion 231 and the clamp portion 203 are disengaged (i.e. the horizontal direction in FIGS. 5 and 6), namely the holes 251b for forklift pin are spaced apart from the portion to be clamped to the right. In other words, when the clamp portion 203 and the portion to be clamped 233 are in engagement with each other (see FIG. 6), the holes 251b for forklift pin are spaced apart from the position of engagement of the clamp portion 203 and the portion to be clamped 233 along the direction in which the clamp portion 203 is disengaged.

The clamping mechanism including the restriction unit 202 having the above described structure and the clamping unit 201 the same as that in the first embodiment operates in the following manner.

First, the pod is transported by a forklift onto the load port and placed on the support table so that the positioning pins are fitted into positioning holes provided on the support table. Then, the lateral oriented clamp portion is rotated and lowered for engagement with the first engagement portion 233 in a similar manner as the first embodiment. Then, the restriction unit operates in the following manner.

The vertical cylinder 267 is driven to extend and move the restriction pin 253 up until it enters into the hole 251a for forklift pin. The restriction pin 253 abuts the abutment surface 251c of the hole 251b for forklift pin, whereby movement of the pod in the horizontal direction is restricted. In addition, movement of the pod in the up and down direction is restricted by the clamping unit 201. Accordingly, even when a force is exerted on the pod in an obliquely upward direction (i.e. in the disengaging direction indicated by arrow y) due to inadvertent application of load on the pod, the pod can be retained in the predetermined position. As will be apparent, disengagement of the pod clamping unit is performed following the process reverse to the above described process.

The shape of the clamp portion 3 and the shape of the portion to be clamped 33 are not limited to those according to the illustrated embodiment, but they may have any shape and be provided at any position as long as they can be brought into a point contact with each other with an appropriate load without sliding relative to each other. In the embodiment, cylinders driven by air are used to drive various members in view of their advantages in preventing application of excessive load. However, the drive system is not limited to the cylinder drive system, but other various drive means in which control of the load and position is easily achieved may be used alternatively.

Third Embodiment

Figure 7:
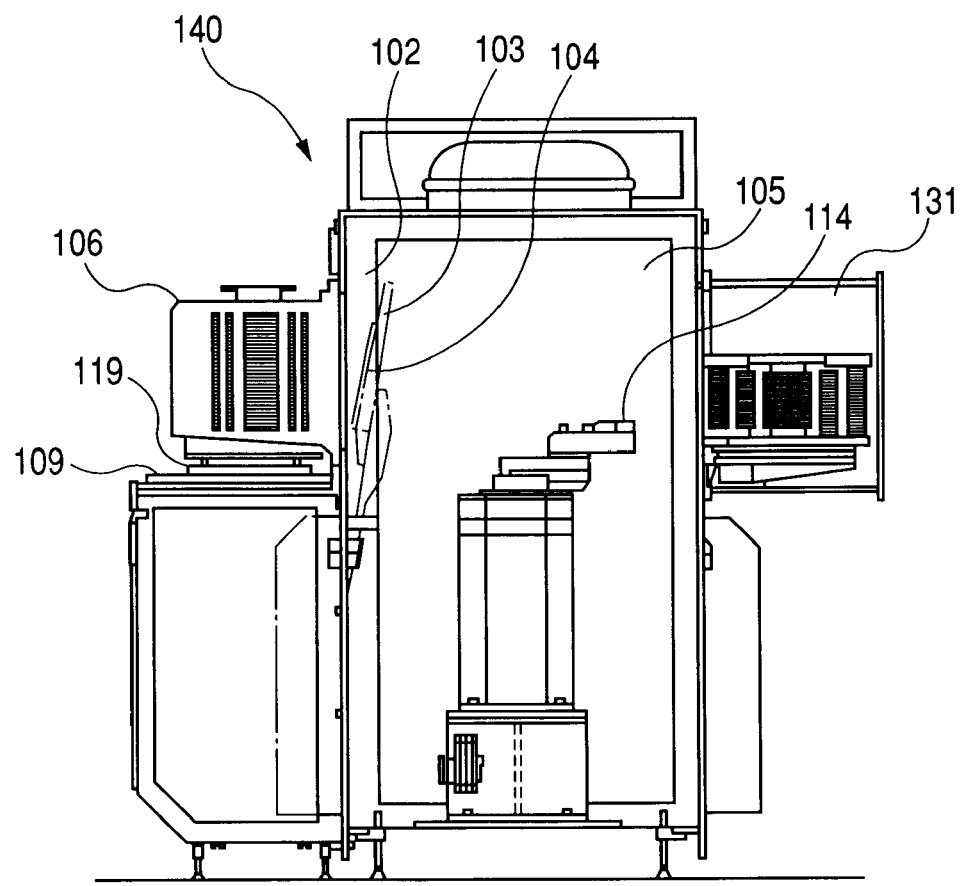
FIG. 7 is a schematic illustration of an FIMS system equipped with the clamping mechanism shown in FIG. 1.
Figure 8:
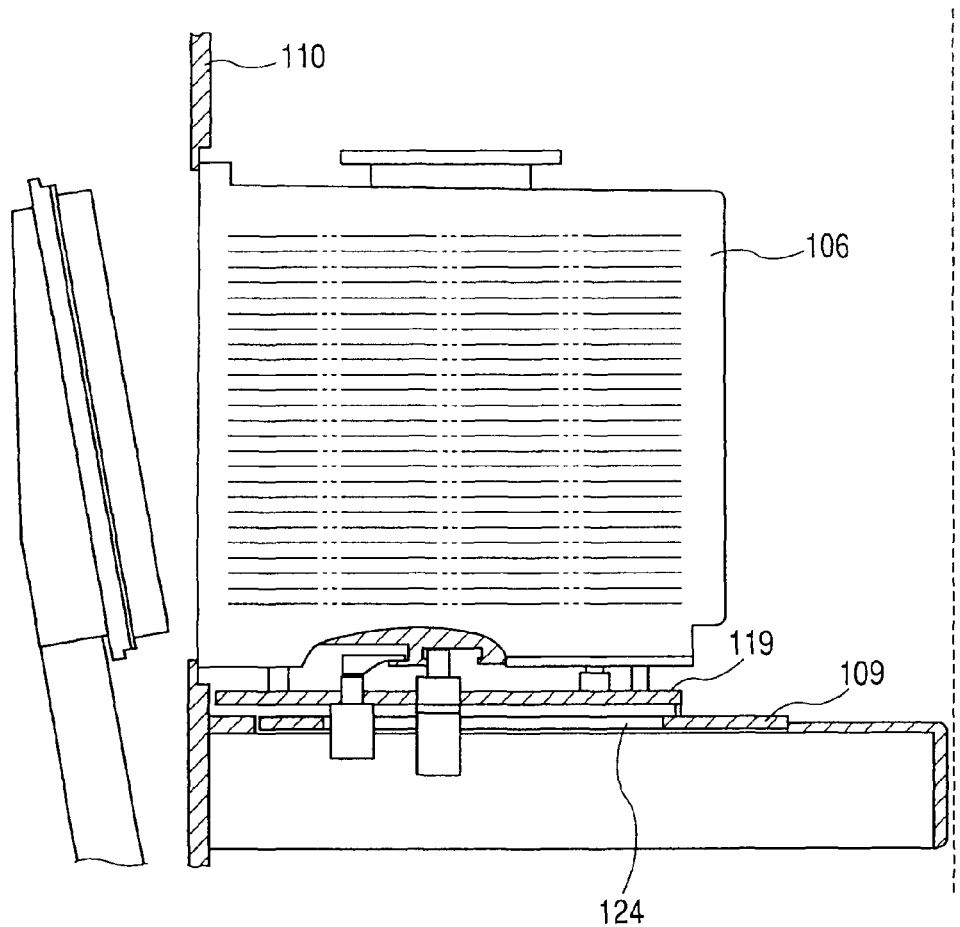
FIG. 8 is a side view showing, partly in cross section, the relevant portion of the FIMS system shown in FIG. 7.
Figure 9:
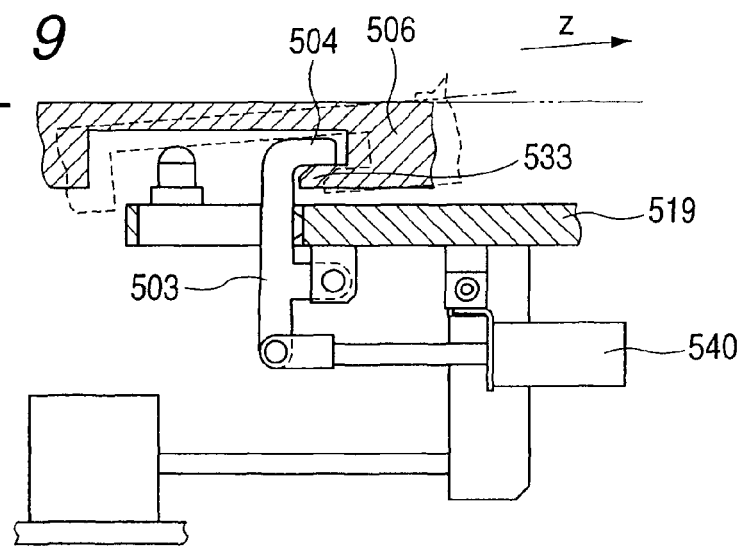
FIG. 9 is a partly sectional illustration of a conventional clamping mechanism.

In the following, an FIMS system having the above described clamp mechanism, a pod to be placed thereon and a wafer transferring apparatus on which the FISM system is mounted will be described as an embodiment of the present invention with reference to FIGS. 7 and 8. FIG. 7 schematically shows a system for transferring wafers or the like from a pod to a processing apparatus. FIG. 8 is a partly sectional illustration of a support table, an aperture, a door and related structures in the FIMS system.

The system illustrated in FIG. 7 includes a small space 105 kept in a highly clean state, a wafer transfer robot 114 set at the center thereof, a substrate receiving stage 131 of the processing apparatus (not shown) provided on a first wall of the space 105 and an FIMS system 140 provided on a second wall of the space 105.

The FIMS system 140 includes the aforementioned second wall of the small space 105, an opening 102, a pod opener or door 103 and a support table 119. The opening 102 is provided on the second wall of the small space 105. The door 103 can be driven by a driving mechanism that is not shown in the drawings to close the opening 102 from inside the small space 105 and can be moved down by the driving mechanism to open the opening 102. On the support table 119 can be placed a pod 106 with its opening side straightly facing the opening 102 of the small space 105. In addition, the pod 106 can be moved toward/away from the opening 102 of the small space 105 by a support table driving means that is not shown in the drawings. The pod 106 houses in its interior a plurality of wafers arranged along the vertical direction at regular intervals. A lid 104 that closes the opening of the pod 106 is securely attached to the opening side of the pod 106. When the wafers are transferred into/out of the FIMS system, the lid 104 is held by the door 103 and moved down with the door to a lower position.

As illustrated in FIG. 8, the support table 119 is disposed on a table 109 that is integral with the wall 110 that has the opening. The support table 119 is connected with an air cylinder by a support member. The air cylinder is fixed to the table 109 in the interior of the rectangular opening 124 provided on the table 109. The air cylinder is used to displace the support table 119 toward or away from the wall 110. The displacement of the support table 119 along the direction toward/away from the wall 110 is restricted by abutment of an abutment member with edges of rectangular opening 124.

A driving member for horizontal movement is provided on the lower surface of the support table 119. The drive member may be one disclosed in Japanese Patent Application Laid-Open No. 2004-015030, which is commonly assigned to the assignee of the present application, and therefore detailed description thereof will be omitted.

In this embodiment, it does not matter which of the erasing clamping unit and the restriction unit is operated earlier, and synchronization of the operations of the clamping unit and the restriction unit is not needed.

In this embodiment, use of an air cylinder or the like makes it possible to make the mechanism required to drive the clamp portion simple and small. Accordingly, the structure according to the present invention can be used without modifying the arrangement of various mechanisms or other features of existing FIMS systems substantially. Consequently, FIMS systems equipped with the clamping unit according to the present invention can also be used with wafer storage containers other than FOUPs.

The pod and the load port used in the embodiment are in compliance with SEMI (Semiconductor Equipment and Material International) standards. (The related provisions of SEMI standards are incorporated herein by reference.) Accordingly, the shapes, dimensions and other properties of the first and second engagement portions are in compliance with SEMI standards. However, it should be understood that pods and load port to which the present invention is applied are not limited to the pod and the load port having the above described structures, but the present invention can also be applied to other types of pod having first and second engagement portion like those described above and load ports having a clamp portion and a restriction pin that can engage with the first and second engagement portions.

Although the restriction pins used in the embodiments have a circular cross section, the cross sectional shape of the restriction pin is not limited to this, but restriction pins may have various cross sectional shapes including elliptical, semicircular, and rectangular shapes, as will be easily seen.

In the pod clamping unit according to the present invention, the clamp portion may be adapted to restrict movement of the pod in the direction opposite to the disengaging direction.

In the pod clamping unit according to the present invention, the position of engagement of the restriction pin and the second engagement portion may be spaced apart from the position of engagement of the cramp clamp portion and the first engagement portion in the disengaging direction.

In the pod clamping unit according to the present invention, the disengaging direction may be the direction of movement of the pod that has a horizontal component and a vertically upward component.

In the pod clamping unit according to the present invention, the first engagement portion and the clamp portion may constitute a front retaining mechanism.

In the pod clamping unit according to the present invention, the second engagement portion may include a hole for a center retaining pin.

In the pod clamping unit according to the present invention, the second engagement portion may include a hole for a forklift pin.

The present invention can be implemented in various forms without departing from the essential features thereof. It should be understood accordingly that the above descriptions of the embodiments have been presented for the sake of explanation, and they are not intended to limit the present invention.

This application claims priority from Japanese Patent Application No. 2006-089922 filed Mar. 29, 2006 which is hereby incorporated by reference herein.

What is claimed is:

1. A pod clamping unit for fixing a pod to a support table in a load port, said pod including a pod body which stores a wafer in the interior thereof and having an opening through which the wafer is to be taken out of/brought into the interior thereof and a lid attached to said pod body to close/open said opening, said load port having a pod opener that opens/closes the opening with said lid, the pod clamping unit comprising:
 a first engagement portion;
 a second engagement portion provided on a lower surface of the pod body;
 a restricting unit; and
 a clamping unit, the clamping unit including:
  a clamp portion;
  a vertical cylinder rod;
  a first vertical cylinder that drives the vertical cylinder rod to move vertically;
  a horizontal cylinder rod connected to the first vertical cylinder; and
  a horizontal cylinder that horizontally drives the horizontal cylinder rod,
  wherein the clamp portion is fixed on an upper end of the vertical cylinder rod that is extendable and retractable in a vertical direction passing through an aperture formed on the support table,
 wherein the restricting unit has a bar-shaped restriction pin and a second vertical cylinder configured to move the restriction pin up and down, the restriction pin is fixed on a piston received in the second vertical cylinder that extends vertically through the support table, and
 wherein while the restriction pin having been moved up by the second vertical cylinder is abutted to the second engagement portion, the first vertical cylinder is configured to drive the clamp portion to move up until a lower surface of the clamp portion is positioned above an upper surface of the first engagement portion.

2. A pod clamping unit according to claim 1, wherein said clamp portion restricts movement of said pod in a direction opposite to a disengaging direction in which the first engagement portion and the clamp portion are disengaged from each other.

3. A pod clamping unit according to claim 2, wherein a position of engagement between said restriction pin and said second engagement portion is spaced apart from a position of engagement between said clamp portion and said first engagement portion in a disengaging direction in which the first engagement portion and the clamp portion are disengaged from each other.

4. A pod clamping unit according to claim 1, wherein a position of engagement between said restriction pin and said second engagement portion is spaced apart from a position of engagement between said clamp portion and said first engagement portion in a disengaging direction in which the first engagement portion and the clamp portion are disengaged from each other.

5. A pod clamping unit according to claim 1, wherein a disengaging direction is a direction of movement of said pod that has a horizontal component and a vertically upward component.

6. A pod clamping unit according to claim 1, wherein said first engagement portion and said clamp portion constitute a front retaining mechanism.

7. A pod clamping unit according to claim 1, wherein said second engagement portion has a hole for a center retaining pin.

8. A pod clamping unit according to claim 1, wherein said second engagement portion has a hole for a forklift pin.

9. A load port apparatus, comprising:
 an apparatus body to be mounted on a semiconductor manufacturing apparatus; and
 a support table on which a pod that stores a wafer to be processed by said semiconductor manufacturing apparatus is to be set, said support table being equipped with a pod clamping unit according to claim 1.

* * * * *